United States Patent [19]

Schade, Jr.

[11] 3,953,807

[45] Apr. 27, 1976

[54] CURRENT AMPLIFIER

[75] Inventor: Otto Heinrich Schade, Jr., N. Caldwell, N.J.

[73] Assignee: RCA Corporation, New York, N.Y.

[22] Filed: Apr. 28, 1975

[21] Appl. No.: 572,007

Related U.S. Application Data

[63] Continuation-in-part of Ser. No. 387,171, Aug. 9, 1973, abandoned.

[52] U.S. Cl................................. 330/35; 330/18; 330/19; 330/22; 330/38 M
[51] Int. Cl.² ........................................ H03F 3/16
[58] Field of Search ............... 307/304; 330/18, 19, 330/22, 35, 38 M, 40

[56] References Cited
UNITED STATES PATENTS
3,775,693   11/1973   Proebsting .......................... 330/35

OTHER PUBLICATIONS
B387,171   1/1975   Schade, Jr. ........................... 330/35

Primary Examiner—R. V. Rolinec
Assistant Examiner—Lawrence J. Dahl
Attorney, Agent, or Firm—H. Christoffersen; S. Cohen; A. L. Limberg

[57] ABSTRACT

A three-terminal current amplifier having a current gain substantially independent of the forward current gains of its component FET's. First and second FET's have source electrodes connected to the common terminal of the amplifier. A third FET has its source electrode connected to the second FET drain electrode and has its gate and drain electrodes connected to the input terminal and the output terminal of the amplifier, respectively. The gate electrodes of the first and second FET's and the first FET drain electrode are coupled to the input terminal by a potential source providing an offset potential smaller than the source-to-gate potential of an FET, which permits the potentials required between the common terminal and each of the input and output terminals to be reduced as compared to prior art FET amplifiers of this sort.

41 Claims, 14 Drawing Figures

_Fig. 1_

_Fig. 2_

_Fig. 3_

_Fig. 4_

CURRENT AMPLIFIER

This application is a continuation-in-part of United States Patent application Ser. No. 387,171, filed Aug. 9, 1973, now abandoned.

The present invention relates to a current amplifier using cascoded enhancement-type field-effect transistors in its output stage.

Current amplifiers using bipolar transistors and having current gains which are dependent upon the ratio of the transconductances of the transistors and substantially independent of the forward current gains of the transistors themselves are known in the prior art. Certain of these configurations developed for bipolar transistor circuits can be adapted for use with field-effect transistors (FET's) of the enchancement type—for example, metal-oxide silicon (MOS) field-effect transistors (MOSFET's). The configurations of principal interest are those in which the output stage uses cascoded transistors, since such an output stage provides the high output impedance generally desired of a current amplifier, despite the transistors not having optimally flat output circuit versus potential characteristics for fixed input circuit biasing conditions.

When realized with bipolar transistors, current amplifiers with cascode output stages need operating potentials no larger than one or two times the base-emitter offset potentials of a bipolar transistor (0.6 to 1.4 volts for silicon transistors). When these current amplifiers employ FET's, the required operating potentials are about one or two times as large as the gate to source potential of these devices.

Since the source-to-gate potential of a conventionally biased FET typically is several volts—for example, 4 to 4.5 volts for one milliampere current flow in enhancement type FET's designed to be compatible in processing with NPN bipolar transistors—the operating potentials required for these current amplifier designs are too large to be acceptable in many applications.

One important aspect of the present invention concerns biasing the output transistor of a cascode amplifier so the input transistor is operated with a smaller quiescent potential across its output circuit than across its input circuit. In a cascode connection of a common-source amplifier FET followed by a common-gate amplifier FET, the quiescent gate potential of the latter FET is chosen so the former FET is operated with lower quiescent source-to-drain potential than quiescent source-to-gate potential; this can be done without incurring voltage-limited saturation or seriously impairing transistor action. Alternatively, in a cascode connection of a common-emitter amplifier junction transistor followed by a common-base amplifier junction transistor, the quiescent base potential of the latter transistor is chosen to operate the former transistor with lower emitter-to-base potential than emitter-to-collector potential; this can be done without incurring saturation or seriously impairing transistor action. Either of these cascode arrangements can be operated without taking up so large a portion of available supply potential.

Another important aspect of the present invention is a three-terminal current amplifier having a current gain substantially independent of the forward current gains of its component FET's and having substantially reduced requirements insofar as input and output potentials are concerned. First and second FET's have source electrodes connected to the common terminal of the amplifier. A third FET has its source electrode connected to the second FET drain electrode and has its gate and drain electrodes connected to the input and output terminals, respectively, of the amplifier. The gate electrodes of the first and second FET's are coupled to the input terminal by means of a potential source providing an offset potential smaller than the source-to-gate potential of a FET, which permits the potentials required between the common terminal and each of the input and output terminals of the amplifier to be smaller than those required by prior art FET amplifiers of this sort.

Another aspect of the present invention is the use of this novel current amplifier as the active collector load of a bipolar transistor to achieve an amplifier stage having very high signal voltage gain.

A further aspect of the present invention is the use of an MOS inverter stage using complementary MOSFET transistors in direct-coupled cascade after the amplifier stage mentioned in the previous paragraph, to achieve an amplifier exhibiting not only high signal voltage gain but also (1) extended output signal swing capabilities for restricted power supply potentials and (2) decreased source impedance in its output circuit.

Figure 1:
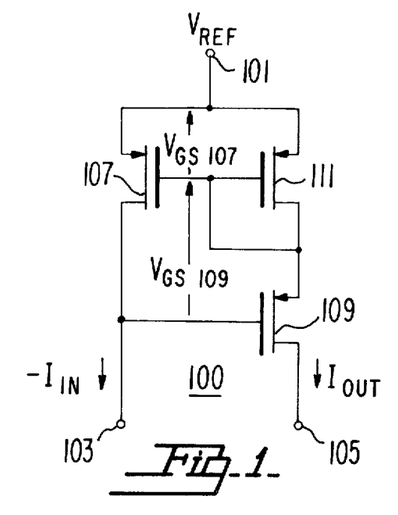
FIGS. 1 and 2 are schematic diagrams of current amplifier configurations with cascoded transistors in their output stage, conventionally realized using bipolar transistors, but here shown employing FET's.

The FIG. 1 current amplifier 100 has a common terminal 101 to accept a reference potential $V_{REF}$, an input terminal 103 for receiving an input current $I_{IN}$, and an output terminal 105 for supplying an output current $I_{OUT}$ responsive to $I_{IN}$. FET 107 is provided with drain-to-gate feedback by the source follower action of FET 109, which feedback regulates the drain current of FET 107 to equal the input current demand -$I_{IN}$ from the input terminal 103. The source-to-gate potential $V_{GS107}$ of FET 107 is adjusted by this regulatory feedback to be of a level characteristic of the particular level of drain current of FET 107. This characteristic potential level impressed between the gate and source electrodes of FET 111 causes it to have a drain current related to the drain current of FET 107 by the ratio of the transconductances of FET's 111 and 107, which ratio of transconductances is primarily controlled by the relative geometries of the FET's 111 and 107. The drain current of FET 111 determines the source current of FET 109. The drain current of FET 109 is substantially equal in amplitude to its source current and thus is substantially equal to the drain current of FET 111.

The FET 109 develops a source-to-gate potential $V_{GS109}$ characteristic of its drain current level. Accordingly, the input terminal 103 is biased to a potential equal to the sum of $V_{GS107}$ and $V_{GS109}$. The drain-to-source potential of FET 109 can be reduced only to its saturation voltage $V_{SAT109}$, or its drain current cannot be sustained. Therefore, for the current amplifier 100 to operate properly, the output terminal 105 can not approach $V_{REF}$ on the common terminal 101 more closely than $V_{GS107}$ and $V_{SAT109}$.

Figure 2:
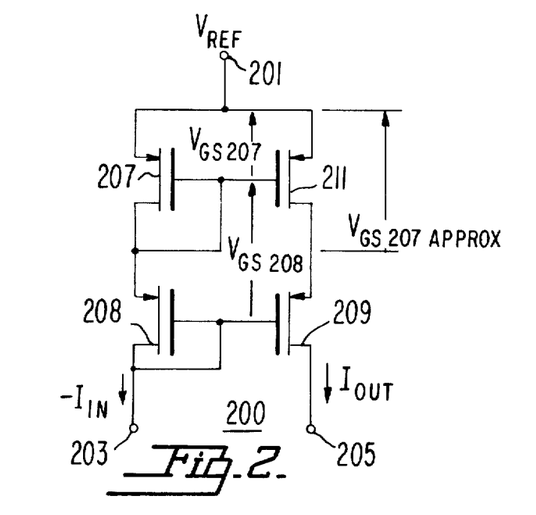

The FIG. 2 current amplifier 200 has a common terminal 201, an input terminal 203 and an output terminal 205. Each of its FET's 207 and 208 is provided with drain-to-gate feedback by means of a direct connection. This feedback regulates the source-to-drain currents of each of these FET's to equal the current $-I_{IN}$ demanded from the input terminal 203. Each of the FET's 207 and 208 develops a source-to-gate potential ($V_{GS207}$ and $V_{GS208}$, respectively) characteristic of this drain-current level; and assuming these FET's to match, the source-to-gate potentials $V_{GS\ 207}$ and $V_{GS\ 208}$ are equal. Therefore, the potential on input terminal 203 should not approach $V_{REF}$ more closely than the sum of $V_{GS\ 207}$ and $V_{GS\ 208}$.

FET 209 is connected as a common-gate amplifier having a drain current of a magnitude equal to its source element, which source current is provided by the drain current of FET 211. That is, FET 207 and 209 are in a cascode arrangement with regard to source-to-gate potentials applied to the gate electrode of FET 207. The drain current of FET 211 is of a level determined by $V_{GS207}$ as impressed between its gate and source electrodes and is related to the drain current of FET 207 by the ratio of their transconductances, which ratio is in turn controlled by the relative geometries of FET's 211 and 207. Just as with FET 109 in current amplifier 100, FET 209 should not be operated with drain-to-source potential less than its saturation voltage $V_{SAT\ 209}$. This restriction can be followed only if the potential at the output terminal 205 does not approach $V_{REF}$ at terminal 201 more closely than the sum of $V_{GS\ 207}$ plus $V_{SAT\ 209}$.

P-type MOSFET's which are suitable for construction within the same integrated circuit as NPN bipolar transistors will have $V_{GS}$'s of 4 to 4.5 volts at drain current levels of 1 milliampere. The $V_{SAT}$'s of such devices will be about 1 or 2 volts. The current amplifier 100 and 200 of FIGS. 1 and 2 therefore require at least 8 to 9 volts of potential between the input and common-terminals to operate properly; and they require at least 5 to 5.5 volts of potential between the output and common terminals to operate properly. Since the operating potentials available for integrated circuits often do not exceed 10 to 15 volts, the minimum requirements of the amplifier 100 and 200 can seriously restrict the potentials which remain available to associated circuitry.

Current amplifier 200 has an advantage over current amplifier 100 in that its current gain is better defined by the ratio of the relative geometries of its FET's 207 and 211 than the current gain of the current amplifier 100 is by the ratio of the relative geometries of its FET's 107 and 111. This comes about because the source-to-drain potentials of FET's 207 and 211 are substantially equal to each other while the source-to-drain potentials of transistors 107 and 111 are not. The source-to-drain voltage of FET 111 will be smaller than that of FET 107 by $V_{GS\ 109}$. In the current amplifier 200, the gate electrodes of FET's 208 and 209 are joined and therefore are at the same potential. The drain potentials of FET's 207 and 211 are more positive than this potential by $V_{GS\ 208}$ and by $V_{GS\ 209}$, respectively; and since $V_{GS\ 208}$ and $V_{GS\ 209}$ can be made equal, the desired equality of the source-to-drain potentials of transistor 207 and 211 can be obtained.

Figure 3:
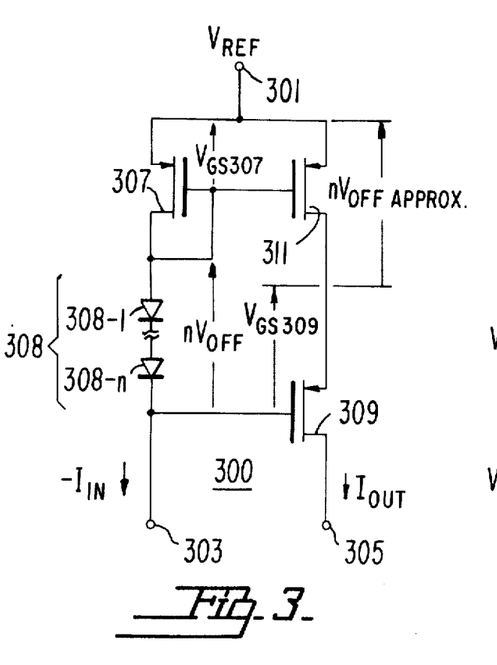
FIG. 3 is a schematic diagram of a current amplifier constructed in accordance with an aspect of the present invention and being adapted to utilize a minimum operating potential.

FIG. 3 shows a current amplifier 300 having a common terminal 301, an input terminal 303 and an output terminal 305, which amplifier 300 embodies the present invention. As FET 307 is provided with drain-to-gate negative feedback to regulate its drain current to equal the current $-I_{IN}$ demanded at terminal 303, which terminal is coupled to its drain electrode by a voltage regulator 308. In the example of the regulator illustrated, a voltage $nV_{OFF}$ develops across regulator 308 proportional to the number $n$ of series connected diodes which are present, and n is chosen to be a value such that this voltage is substantially smaller than the source-to-gate potential $V_{GS\ 307}$ of FET 307.

As mentioned above, FIG. 3 shows the voltage regulator 308 as comprising n serially connected diodes 308-1 through 308-n. These diodes are arranged to be forward-biased by the drain current of FET 307. Each of the forward biased diodes develops a potential $V_{OFF}$ thereacross in response to the drain current of FET 307, making the total offset potential afforded by the voltage regulator 308 equal to $nV_{OFF}$. The gate electrode of FET 309 is offset from $V_{REF}$ at terminal 301 by a potential equal to $V_{GS\ 307}$ plus $nV_{OFF}$.

$V_{GS\ 307}$ is applied between the gate and source electrodes of FET 311 causing a drain current therefrom which is related to the drain current of FET 307 by the ratio of the transconductances of transistors 311 and 307. This drain current of FET 311 is coupled with unity gain through the common-gate amplifier action of FET 309 to the output terminal 305. In response to the source current thus provided FET 309 from the drain electrode of FET 311, FET 309 develops source-to-gate potential $V_{GS\ 309}$ characteristic of this current level. The source electrode of FET 309 will thus be at a potential equal to $V_{GS\ 307}$ plus $nV_{OFF}$ minus $V_{GS\ 309}$. Assuming $V_{GS\ 309}$ to be similar to $V_{GS\ 307}$, the source electrode of FET 309 will be offset from the potential $V_{REF}$ on terminal 301 by a potential substantially equal to $nV_{OFF}$. The number of diodes n, is chosen such that $nV_{OFF}$ is greater than the saturation voltage of FET 311. A value of n equal from two to four usually suffices.

The potential on terminal 305 can approach $V_{REF}$ on terminal 301 as closely as $nV_{OFF}$ plus $V_{SAT\ 309}$, the saturation voltage of FET 309. This potential ($nV_{OFF}$ + $V_{SAT\ 309}$) can be as small as 2.5 volts. So, generally speaking, this leaves an appreciable amount of the supply potential applied to an integrated circuit using the current amplifier 300, available to other circuitry associated therewith.

The current amplifier is useful in thin-film MOSFET circuitry such as that using silicon-on-sapphire (SOS) techniques. SOS transistors of the N-channel type exhibit substantial increases in drain current when their drain-to-source voltage is increased beyond 3 or 3.5 volts. The cascode output stage employing transistors 311 and 309 provides high output impedance when the source-to-drain potential of transistor 311 is maintained at lower potential by appropriately selecting the offset potential maintained by potential regulator 308.

Figure 4:
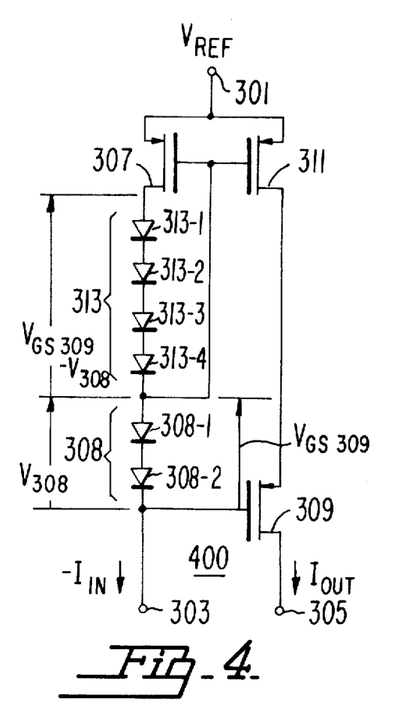
FIG. 4 is a schematic diagram of a current amplifier constructed in accordance with an aspect of the present invention and being adapted for inverting signal currents.

FIG. 4 shows a current amplifier 400, which is similar to the current amplifier 300 of FIG. 3 except for the inclusion of a voltage regulator 313 coupled between the drain electrode of transistor 307 and the interconnected gate electrodes of FETs 307 and 311. The voltage regulator causes the FET 307 to have a lower source-to-drain voltage than source-to-gate voltage. The sum of the regulated potentials provided by voltage regulators 308 and 313 is made to be substantially equal to $V_{GS\ 309}$. Thus, the drain electrode of FET 307 is positive with respect to the potential appearing at input terminal 303 by an amount equal to $V_{GS\ 309}$, just as the drain electrode of FET 311 is positive owing to the source-follower action of FET 309. Since the drain potentials of FET's 307 and 311 are equal, and since their source potentials also are equal because both source electrodes are connected to the same circuit point—terminal 301, the source-to-drain potentials of FET's 307 and 311 are substantially equal. Therefore, the current gain of the current amplifier 400 is determined by the ratio of the relative conductances of FET's 307 and 311 as determined by the dimensions of their channels, without any error being introduced because of the source-to-drain voltages of these FET's being different from each other.

The diodes in voltage regulator 308 and 313 typically are formed from NPN transistors. Each such transistor has its base and collector electrodes connected to serve as an anode and its emitter electrode serves as a cathode. Others forms of junction diode or Schottky diodes may be used instead. Also, certain NPN transistor voltage regulators known in the prior art are suitable for alternative embodiments of the present invention. In fact, any potential sources having the proper offset potentials may replace the voltage regulators 308 and 313.

Figure 5:
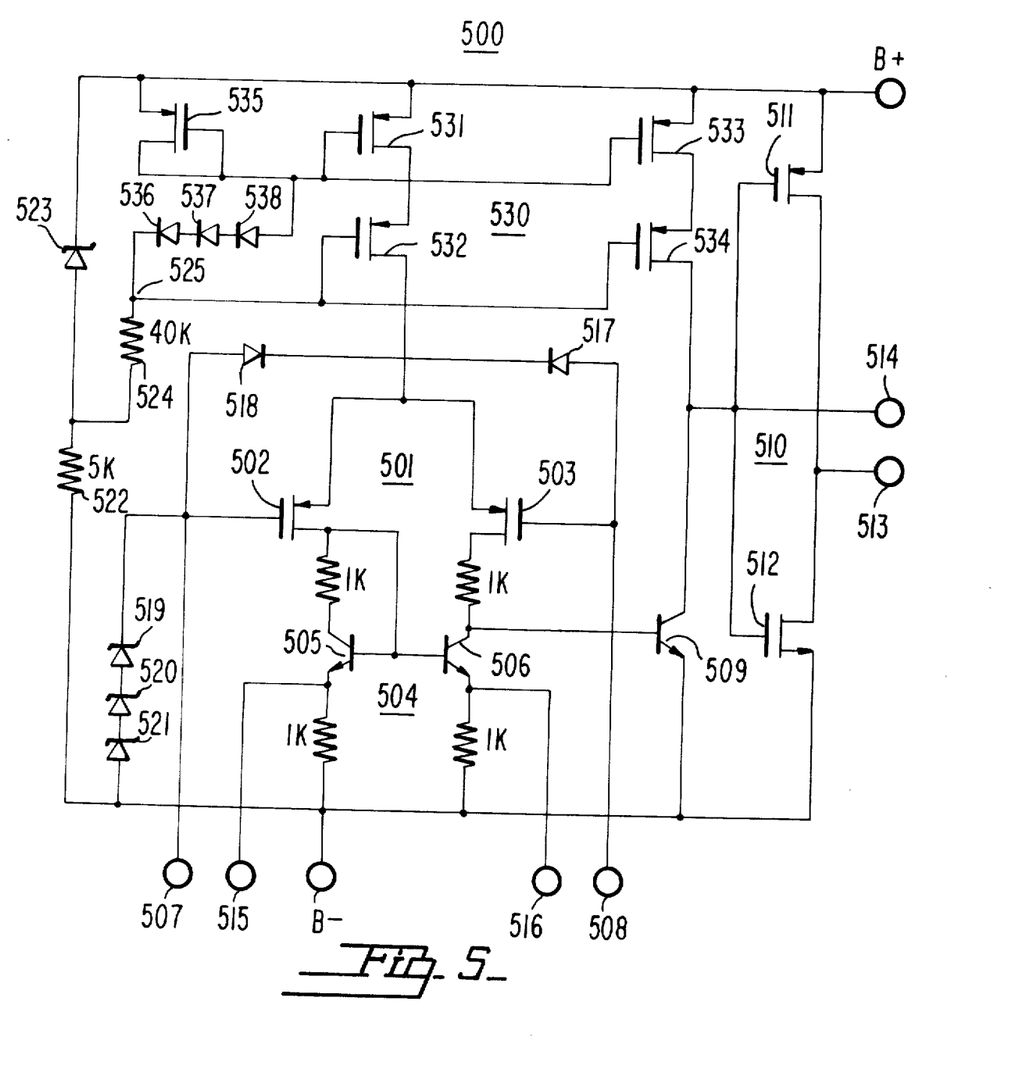
FIG. 5 is a schematic diagram of an operational amplifier constructed in accordance with an aspect of the present invention.

FIG. 5 shows an operational amplifier 500 using both MOSFET's and bipolar transistors. Amplifier 500 is suited for inclusion within a single monolithic integrated circuit, the terminals B+ and B− being adapted for application of operating potential therebetween.

The differential amplifier 501 uses source-coupled FET's 502 and 503 having their drain electrodes connected to an active balun comprising a current amplifier 504 using NPN bipolar transistors 505 and 506. The differential amplifier 501 is of a type more fully described in my United States Patent application Ser. No. 318,646 filed in the name of Otto H. Schade, Jr., Dec. 26, 1972, entitled IMPROVEMENT FOR CURRENT MIRROR APPLICATIONS and assigned like the present application to RCA Corporation.

Input signals applied between terminals 507 and 508 are differentially amplified by differential amplifier 501 to provide a signal for application to the base-emitter junction of a grounded-emitter NPN bipolar transistor 509. The twice-amplified signal appearing at the collector electrode of transistor 509 is applied to a complementary-MOS inverting-amplifier output stage 510 (a COSMOS inverter) comprising a P-channel MOSFET 511 and an N-channel MOSFET 512, which stage 510 supplies an output signal at terminal 513 in response to the twice-amplified signal.

Terminal 514 provides access to the driver stage transistor 509 collector electrode. When the amplifier 500 is used in feedback loops, capacitive and resistive elements, not shown, can be connected between terminals 514 and 516 to affect the gain and phase shift of the output stage 510 to aid in the stabilization of the loop. Terminals 515 and 516 are adapted for connection to separate ones of the end terminals of a potentiometer having a slider terminal connected to B− terminal and being used for adjusting the current level in the driver stage transistor 509. Diodes 517–521 are protection diodes to prevent certain over-voltage conditions and are non-conductive during normal circuit operation.

Resistor 522 is arranged for biasing avalanche diode 523 into breakdown to develop a regulated potential with respect to B+ potential. This regulated potential is coupled via resistor 524 to the input node 525 of a current amplifier 530, similar to the current amplifier 300 of FIG. 3. However, current amplifier 530 uses two cascode output stages parallelly biased, one of which stages supplies the combined source currents of transistors 502 and 503 and the other of which provides a constant-current collector load to transistor 509. The two cascode output stages of the current amplifier 530 share the same input stage, effecting an economy of circuit elements. Since their component FET's 531–534 are voltage controlled devices with substantially no input current demands, the two cascode output stages exhibit no adverse interactions between each other.

The input current to node 525 is designed to be at the 100 microampere level at which level the source-to-gate potential of FET 535 in the input stage of current amplifier 530 exhibits substantially no change with temperature rise. For a 100° K temperature rise, the avalanche breakdown voltage of diode 523 will increase 0.3 volt. The offset potential across three semiconductor junction diodes 536, 537, 538 in the input stage of current amplifier 530 will decrease 0.5 volt for the same temperature rise. The sum of these potential changes, an increase of 0.8 volts for the 100° K temperature rise will appear across the resistor 524 and will provide substantially perfect compensation for its increased resistance. (The resistor 524 is formed by the same diffusion used to form the base regions of the NPN bipolar transistors, when the circuitry of FIG. 5 is realized in PMOS-bipolar NPN integrated-circuit transistor technology).

The selection of the number of diodes used in the voltage regulator 308 of a current amplifier 300 as shown in FIG. 3 can then be made to facilitate temperature-compensation of $I_{OUT}$. Since $V_{GS}$ of an FET having a typical geometry begins to exhibit an increase with increased temperature for drain current levels in excess of 100 microamperes, the availability of the decrease in offset potential of diodes 308-1 . . . 308-n with increasing temperature, will in some circuit situations permit temperature-compensation of $I_{OUT}$ where such compensation would be impossible with the circuits of FIGS. 1 and 2. This advantage of the FIG. 3 circuit may show up even where $nV_{OFF}$ exceeds $V_{GS\ 309}$.

The lowered potential across the cascoded FET's 531 and 532 of current amplifier 530, which is made possible by the present invention, permits larger common-mode signal to be applied to differential amplifier 501 at input terminals 507 and 508.

The lowered potential across the cascoded FET's 533 and 534 of current amplifier 530, which is made possible by the present invention, permits the collector electrode of driver stage transistor 509 to be swung over a greater portion of the potential range between B− and B+ potentials. This, coupled with the use of a CMOS inverter output stage which has a signal voltage gain, rather than an emitter-follower output stage which does not, permits excursions of the output signal voltage at terminal 513 over substantially the entire range of B− to B+ potential. Further, the high load impedance provided at the drain electrode of transistor 534 to the collector of transistor 509 and the high transconductance of the NPN bipolar transistor permits the driver stage to exhibit very high voltage gain—in a neighborhood of 8000. The P-channel MOS transistor 534 provides a better active load than a lateral PNP bipolar transistor would, since it does not exhibit the frequency limitations nor the non-linear current gain typical of a lateral PNP bipolar transistor. Thus, the current amplifier 300 provides a new basic building block useful for realizing an improved operational amplifier driver and output stage combination.

Figure 6:
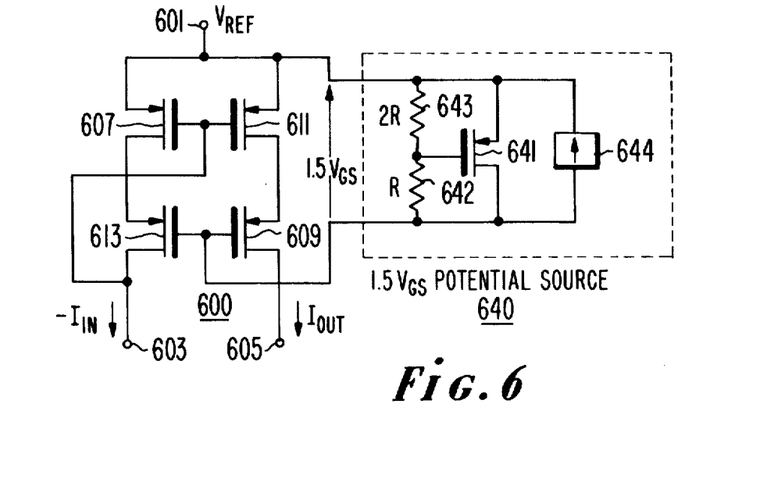
FIG. 6 is a schematic diagram of a current amplifier constructed in accordance with an aspect of the present invention, having cascode arrangements in both its input and output circuits and being adapted to utilize a minimal operating potential.

FIG. 6 shows a current amplifier 600 with input terminal 603, common terminal 601 and output terminal 605. In current amplifier 600, both the input and output circuits comprise cascode connections respectively of FET's 607 and 613 and of FET's 611 and 609. The input terminal 603 is connected to the joined gate electrodes of FET's 607 and 611. This completes a direct-coupled drain-to-gate feedback connection for FET 607, which connection includes FET 613 as common-gate amplifier. This feedback adjusts the source-to-gate potential of FET 607 to cause its drain current as coupled without change in amplitude through common-gate amplifier FET 613 to meet with precision the demand for $-I_{IN}$ placed on input terminal 603. The same source-to-gate potential as applied to FET 607 is applied to FET 611 causing the drain current of FET 611 to be proportional to the drain current of FET 607 essentially in direct proportion to their relative transconductances. The drain current of FET 611 is coupled without change in amplitude through common-gate amplifier FET 609 to the output terminal 605 to flow as $I_{OUT}$.

The gate electrodes of FET's and 609 and 613 are offset in potential from the reference voltage $V_{REF}$ applied to terminal 601; this is done by potential source 640. The offset potential is selected to be about midway between (a) the expected value of gate-to-source potential for FET 607 and (b) the sum of the expected value of gate-to-source potentials for FET's 607 and 613. Assuming FET's 607 and 611 to have similar transconductances to those of transistors 613 and 609, respectively, their gate-to-source potentials will all be substantially equal to the same value of $V_{GS}$. If potential source 640 is designed to provide an offset 1.5 times $V_{GS}$, FET 613 having a drain potential of $-V_{GS}$ as referred to terminal 601 will be operated with a drain-to-source potential of 0.5 $V_{GS}$. The source electrodes of FET's 613 and 609 are $V_{GS}$ more positive than their gate electrodes. With their gate electrodes at 1.5 $V_{GS}$ are referred to $V_{REF}$ at common terminal 601, the source electrodes of FET's 613 and 609 and the drain electrodes of FET's 607 and 611 to which they respectively connect are at $-0.5$ $V_{GS}$ as referred to $V_{REF}$. So, FET's 607 and 511 are both operated with similar source-to-drain voltages of $-0.5$ $V_{GS}$, largely obviating the effect of dissimilarity in these voltages affecting the proportioning of their transconductances.

The potential source 640 can take a variety of forms. As shown, it comprises an FET 641 having drain-to-gate feedback applied by means of a resistive potential divider comprising resistances 642 and 643. This feedback adjusts the source-to-gate potential of FET 641 so its source-to-drain current equals the current supplied by a constant-current source 644. A 1.5 $V_{GS}$ potential must be developed across the serial connection of the potential divider resistances 642 and 643 in order that a 1 $V_{GS}$ potential may appear across resistance 643 by reason of its value (2R) being twice that (R) of resistance 642. Alternatively, the 1.5 $V_{GS}$ potential could be developed by the potential drop across a series connection of forwardbiased semiconductor junctions or self-biased transistors.

Figure 7:
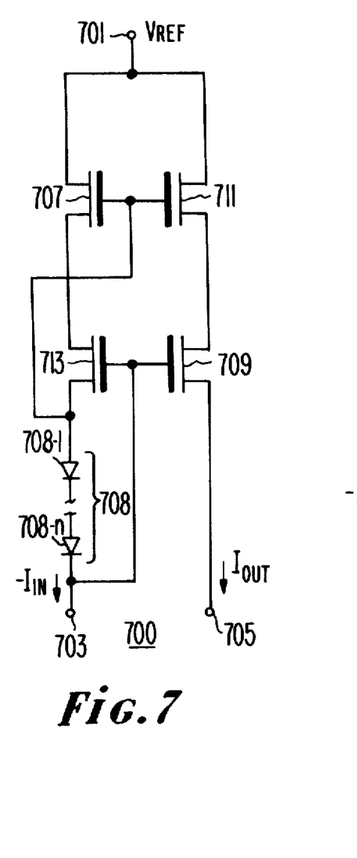
FIGS. 7, 8 and 9 are schematic diagrams of current amplifiers alternative to that shown in FIG. 6, each of which has cascode arrangements in its input and output circuits and is constructed in accordance with an aspect of the present invention.

FIG. 7 shows a current amplifier 700 which is similar in general principle of operation to the current amplifier 600 of FIG. 6. In this figure and in the following ones, the parts with corresponding last two digits in their reference numerals operate analogously to the corresponding parts in the current amplifier of FIG. 6. In current amplifier 700, however, the commongate amplifier FET's 713 and 709 in the input and output circuit cascodes, do not have their gate electrodes biased by a 1.5 $V_{GS}$ potential source 640 connected between them and the current amplifier common terminal 701. Rather, the gate electrodes of FET's 713 and 709 are biased 0.5 $V_{GS}$ more positive than the gate electrodes of FET's 707 and 711 by a potential source 708 connected between the two sets of base electrodes. This potential source 708 is shown in FIG. 7 as comprising diodes 708-1, . . . 708-n serially connected to respond to the flow of the current $-I_{IN}$ to develop the desired 0.5 $V_{GS}$ offset potential between (a) the joined gate electrodes of FET's 707 and 711 and (b) the joined gate electrodes of FET's 713 and 709.

Figure 8:
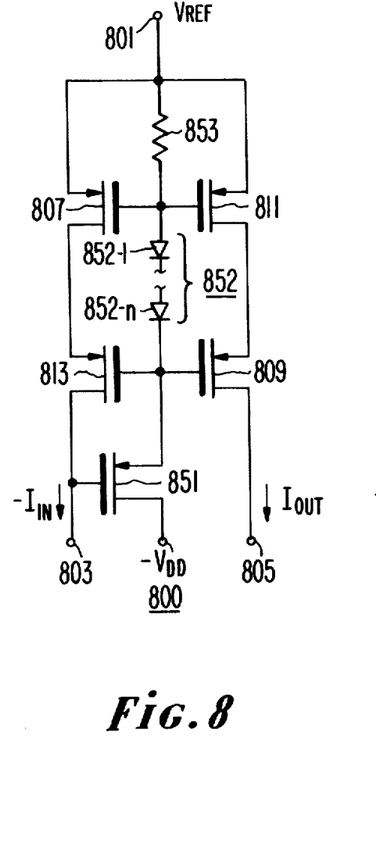

In the current amplifier 800 of FIG. 8, a potential source 852 determines the offset potential between (a) the joined gate electrodes of FET's 807 and 811 and (b) the joined gate electrodes of FET's 813 and 809. This potential source is provided by the potential regulating properties of forward-biased diodes 852-1, . . . 852-n included in the drain-to-gate feedback connection of FET 807. This feedback connection is from the drain of FET 807, via the channel of FET 813 as a common-gate amplifier, via the source-follower action of common-drain amplifier FET 851, via foward-biased diodes 852-1, . . . 852-n, to the gate electrode of FET 807. A resistor 853 provides the path from a positive operating potential such as $V_{REF}$ for the current to forward bias diodes 852-1, . . . 852-n and thence to flow as source current to FET 851. The resistance of resistor 853 is chosen small enough with respect to stray capacitance in the circuit to secure adequate bandwidth of the current amplifier response. Since FET 851 diverts substantially no portion of the $-I_{IN}$ current to itself as gate current, the gate current of a FET being theoretically zero (and, in most practical circuits, negligibly small compared to signal and operating currents) making the resistance of resistor 853 smaller does not affect the current gain of current amplifier 800, though it does increase the heat generated within the amplifier.

Figure 9:
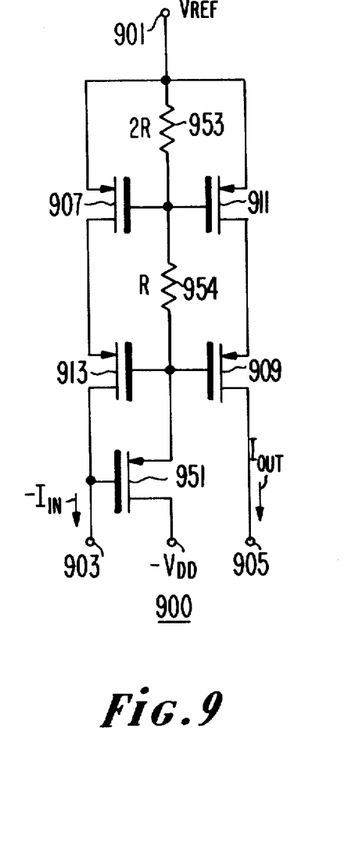
Figure 10:
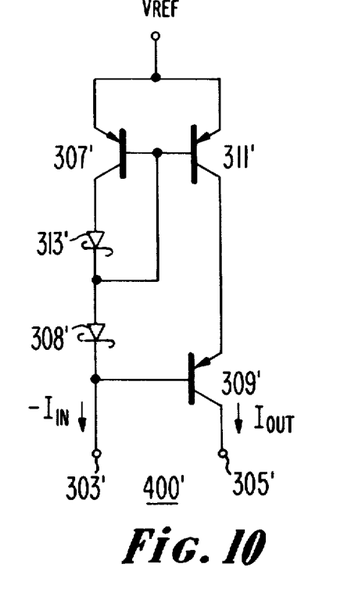
FIGS. 10, 11, 12, 13 and 14 are schematic diagrams of current amplifiers related to those shown in FIGS. 4, 6, 7, 8 and 9, respectively, each constructed in accordance with an aspect of the present invention.
Figure 11:
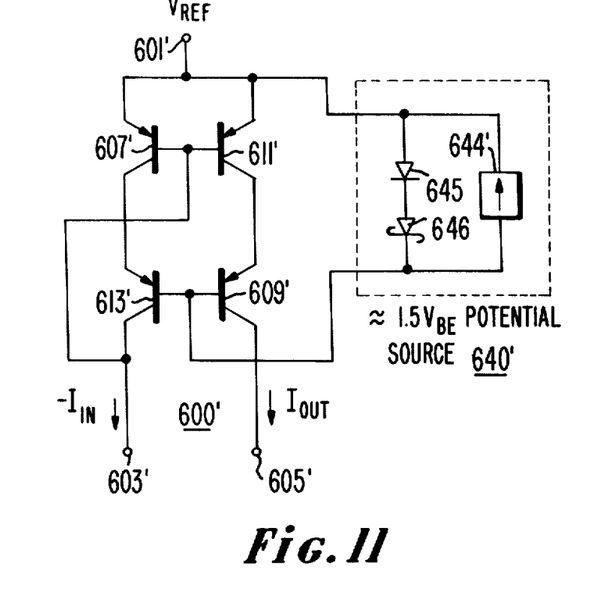
Figure 12:
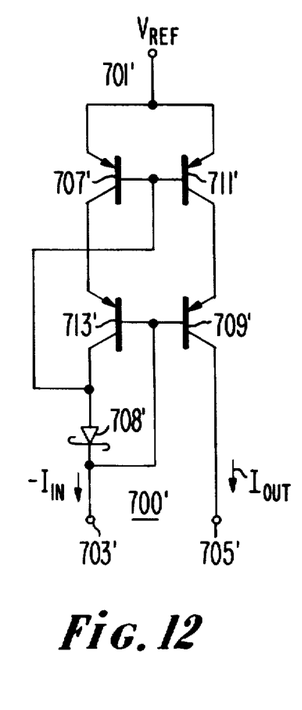
Figure 13:
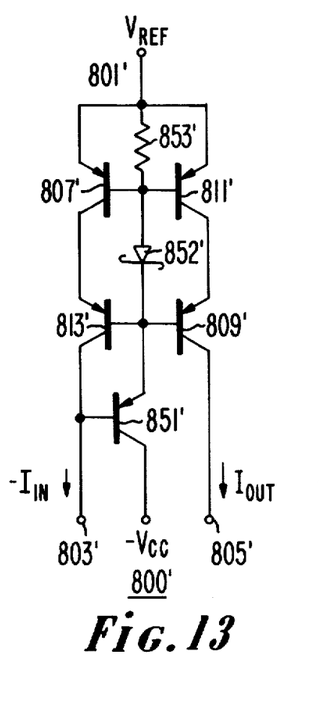
Figure 14:
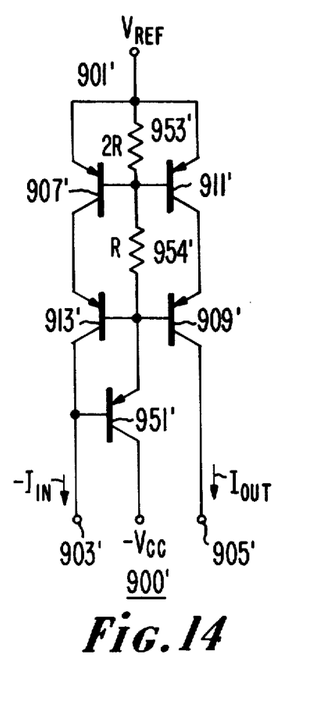

FIG. 9 shows a current amplifier 900 which is a variant of current amplifier 800. The potential offset between (a) the joined gate electrodes of FET's 907 and 911 and (b) the joined gate electrodes of FET's 913 and 909 is developed by the resistive potential divider action between resistances 954 and 953 which are in approximately 1:2 ratio.

The present invention is particularly useful in reducing the range of potential needed for the proper operation of a current amplifier constructed with cascoded FET's because of FET's having source-to-gate and source-to-drain potentials of a few volts during normal operation. But, even cascodes of junction transistors—as, for example, used in current amplifiers—can be constructed using the teachings of the present invention, This is done by taking advantage of the fact that Schottky diodes when "forward-biased" maintain potential offsets across themselves substantially equal to one-half the offset potential across the base-emitter junction of a transistor which is operated normally. FIGS. 10, 11, 12, 13 and 14 show current amplifiers 400', 600', 700', 800' and 900' of this type which are analogous to current amplifiers 400, 600, 700, 800 and 900, respectively. Current amplifiers 400', 600', 700', 800' and 900' and their like are particularly useful in circuits constained to use operating potentials of only 1.5 to 2 volts. The operation of these circuits should be self-evident from the explanations already given of their FET counterparts of the previous figures.

What is claimed is:

1. In a combination of first and second transistors, each transistor having input and common and output electrodes and each transistor exhibiting transconductance by responding to potential applied between its common and input electrodes whenever that potential exceeds a threshold value to conduct a current between its output and common electrodes, and means connecting said first and said second transistors in cascode configuration, said means including:

means connecting said first transistor output electrode to said second transistor common electrode;

means for applying a reference potential to said first transistor common electrode, means for applying an operating potential to said second transistor output electrode, means for applying an input signal superimposed on a first quiescent bias potential to said first transistor input electrode; and means for taking from said second transistor output electrode an output signal responsive to said input signal, the improvement comprising means for applying a second quiescent bias potential to said second transistor input electrode of a value respective to said reference potential and said first quiescent potential such that said first transistor is operated with a quiescent potential between its common and output electrodes that is smaller than said first quiescent potential as referred to said reference potential, but that is sufficently large so that transistor action is maintained in said first transistor.

2. A current amplifier comprising:

an input, an output, and a common terminal;

first and second and third field effect transistors, each having gate and source and drain electrodes, the source electrodes of said first and said second transistors being direct current conductively coupled to said common terminal, the source electrode of said third transistor being connected to the drain electrode of said second transistor, the drain electrode of said third transistor being connected to said output terminal;

a first interconnection to which the gate electrodes of said first and second transistors are each connected;

a direct-coupled drain-to-gate feedback connection for said first transistor including, firstly, direct current conductive means connecting the drain electrode of said first transistor to said input terminal and, secondly, means for direct coupling said input terminal to said first interconnection; and means for maintaining a potential between said common terminal and the gate electrode of said third transistor of a value such that during operation of the current amplifier the source follower action of said third transistor will impose a source-to-drain potential on said second transistor smaller than its quiescent source-to-gate potential.

3. A current amplifier as set forth in claim 2 wherein said direct current conductive means connecting the drain electrode of said first transistor to said input terminal comprises:

a fourth field effect transistor having source and drain electrodes respectively connected to said first transistor drain electrode and to said input terminal and having a gate electrode connected to receive a potential substantially the same as the potential maintained at the gate electrode of said third transistor.

4. A current amplifier as set forth in claim 3 wherein said means for maintaining a potential between said common terminal and the gate electrode of said third transistor comprises:

a second interconnection, to which the gate electrodes of said third and said forth transistors are connected;

a constant-current source connected between said common terminal and said second interconnection; and impedance means connected between said common terminal and said second interconnection.

5. A current amplifier as set forth in claim 4 wherein said impedance means comprises:

a fifth field effect transistors having a gate electrode and having source and drain electrodes connected respectively to said common terminal and the said second interconnection, together with first and second resistances in 2:1 ratio, the first being connected between the gate and source electrodes of said fifth transistor and the second being connected between the gate and drain electrodes of said fifth transistor.

6. A current amplifier as set forth in claim 4 wherein said means for direct coupling said input terminal to said first interconnection is a direct connection without any substantial intervening element.

7. A current amplifier as set forth in claim 3 wherein said means for direct coupling said input terminal to said first interconnection comprises:

a fifth field effect transistor having source and drain electrodes and having a gate electrode connected to said input terminal;

means connected to the drain electrode of said fifth transistor for conditioning it to operate as a source-follower or common-drain amplifier stage;
means connected between the source electrode of said fifth transistor and said first interconnection for regulating the potential between them, and
first resistive means connected between said first interconnection and said common terminal.

8. A current amplifier as set forth in claim 7 wherein said means for maintaining a potential between said common terminal and the gate electrode of said third transistor comprises a connection of the gate electrode of said third transistor to the source electrode of said fifth transistor, so which the gate electrode of said forth transistor is also connected.

9. A current amplifier as set forth in claim 8 wherein said means for regulating the potential between the source electrode of said fifth transistor and said first interconnection comprises:
a plurality of diodes connected serially between said first interconnection and said fifth transistor source electrode and poled to be rendered forward conducting by the source current of said fifth transistor.

10. A current amplifier as set forth in claim 3 wherein said means for direct coupling said input terminal to said first interconnection comprises:
a fifth field effect transistor having source and drain electrodes and having a gate electrode connected to said input terminal;
means connected to the drain electrode of said fifth transistor for conditioning it to operate as a source-follower or common-drain amplifier stage;
means connected between the source electrode of said fifth transistor and said first interconnection for regulating the potential between them; and
second resistive means connected between said first interconnection and the source electrode of said fifth transistor.

11. A current amplifier as set forth in claim 10 wherein said means for maintaining a potential between said common terminal and the gate electrode of said third transistor comprises a connection of the gate electrode of said third transistor to the source electrode of said fifth transistor, to which the gate electrode of said fourth transistor is also connected.

12. A current amplifier as set forth in claim 2 wherein said means for maintaining a potential between said common terminal and the gate electrode of said third transistor comprises, in addition to said first transistor and its direct-coupled drain-to-gate feedback connection, a connection of the third transistor gate electrode to said input terminal.

13. A current amplifier comprising:
an input, an output and a common terminal;
first and second and third field effect transistors, each having gate and source and drain electrodes, the source electrodes of said first and said second transistors being direct current conductively coupled to said common terminal and their gate electrodes having an interconnection therebetween, the source electrode of said third transistor being connected to the drain electrode of said second transistor; the gate and the drain electrodes of said third transistor being respectively connected to said input and said output terminals;
means for direct coupling said first transistor drain electrode to said interconnection; and
first potential regulating means connected between said input terminal and said interconnection for maintaining the potential therebetween substantially smaller than the source-to-gate potential of a self-biased field effect transistor of the same type as said first, said second and said third field effect transistors.

14. A current amplifier as claimed in claim 13 wherein said first potential regulating means comprises:
a plurality of diodes which are serially connected between said interconnection and said input terminal and are poled so as to be forward biased by the drain current of said first transistor.

15. A current amplifier as claimed in claim 14 having in combination therewith:
an avalanche diode having a first and a second electrodes, said first electrode being connected to said common terminal;
a source of current connected to said second electrode of said avalanche diode, said source poled to provide said current in a polarity to maintain said avalanche diode in reverse breakdown; and
resistive means for coupling said second electrode of said avalanche diode to said input terminal, whereby the coefficients of change with temperature change of the source-to-drain potential of said first transistor, the offset potentials of said forward biased diodes in said first plurality, the reverse breakdown potential of said avalanche diode and the resistance of said resistive means interact so as to offset each others effects upon the change with temperature change of the drain currents of said third transistor.

16. A current amplifier as set forth in claim 13 wherein said memans for direct current conductively coupling said first transistor drain electrode to said interconnection comprises:
a second voltage regulating means operating in conjunction with said first voltage regulating means to maintain the potential between said first transistor drain electrode and said input terminal substantially equal to the source-to-gate potential of said third transistor.

17. A current amplifier as set forth in claim 16 wherein said second voltage regulating means comprises:
a forth field effect transistor having a gate electrode connected to said input terminal, having a source electrode connected to said first transistor drain electrode, and having a drain electrode connected to said interconnection.

18. A current amplifier as set forth in claim 16 wherein said second voltage regulating means comprises:
a plurality of diodes, which are serially connected between said first transistor drain electrode and said itnerconnection and are arranged so as to be biased into conduction by the drain current of said first transistor.

19. A current amplifier as set forth in claim 13 wherein said means for direct current conductively coupling said first transistor drain electrode to said interconnection solely comprises:
a direct connection between said first transistor drain electrode and said interconnection.

20. A current amplifier as claimed in claim 13 having in combination therewith:
a current supply coupled between the input and common terminals of said current amplifier;

a bipolar transistor having a base and an emitter electrodes with a base-emitter semiconductor junction therebetween and having a collector electrode connected to said output terminal of said current amplifier to receive quiescent current therefrom responsive to current from said supply; and means adapted for applying bias and input signal to said base-emitter semiconductor junction of said bipolar transistor and for applying operating potential between the common terminal of said current amplifier and said emitter electrode of said bipolar transistor.

21. A current amplifier as claimed in claim 13 having in combination therewith:

a current supply coupled between the input anad common terminals of said current amplifier;

a bipolar transistor having a base and an emitter electrodes with a base-emitter semiconductor junction therebetween and having a collector electrode connected to said output terminal of said current amplifier to receive quiescent current therefrom responsive to current from said supply;

means adapted for supplying bias an input signal to said base-emitter semiconductor junction of said bipolar transistor;

a fourth field effect transistor of the same type as said first through third field-effect transistors and a fifth field effect transistor of a complementary type thereto, each of said fourth and said fifth field-effect transistors having a gate electrode direct coupled to said output terminal of said current amplifier, each of said fourth and said fifth field effect transistors having a drain electrode joined to that of the other for providing output signal responsive to said input signal, said fourth field effect transistor having a source electrode connected to said common terminal of said current amplifier, said fifth field effect transistor having a source electrode to which said bipolar transistor emitter electrode is connected; and means adapted for applying operating potential between the source electrodes of said fourth and said fifth field effect transistors.

22. A current amplifier comprising, in combination: a common terminal, an input terminal and an output terminal;

three field-effect transistors, each having source, gate and drain electrodes, the first and second connected at their source electrode to said common terminal and connected gate electrode-to-gate electrode, the third transistor connected at its source electrode to the drain electrode of the second transistor, at its drain electrode to said output terminal, and at its gate electrode to said input terminal, and said first transistor connected at its drain electrode to its gate electrode; and means for establishing a quiescent potential difference between the gate electrode of said first transistor and said input terminal which is substantially smaller than the source electrode-to-gate electrode potential of a self-biased field-effect transistor of the same type as said first, second and third transistors, and at least slightly greater than the saturation voltage of said second transistor.

23. A current amplifier as set forth in claim 22 wherein said means for establishing a potential difference between the gate electrode of said first transistor and said input terminal comprises n serially connected diodes, connected to conduct current in the forward direction between said input terminal and said drain electrode of said first transistor, where n is an integer equal to at least 2.

24. A current amplifier as set forth in claim 22, further including means for establishing a quiescent potential difference between the drain and gate electrodes of said first transistor.

25. A current amplifier as set forth in claim 24 wherein the combined action of said means for establishing a quiescent potential between said first transistor gate electrode and said input terminal and of said means for establishing a quiescent potential difference between the drain and gate electrodes of said first transistor establishes a potential between said first transistor drain electrode and said input terminal substantially equals the source-to-gate potential of said third transistor for given levels of current in said current amplifier.

26. A current amplifier comprising:

an input, an output and a common terminal;

first, second and third field effect transistors, each having a gate, a source and a drain electrode;

means for coupling the source electrodes of said first and said second transistors to said common terminal;

means for coupling said second transistor drain electrode to said third transistor source electrode;

means for coupling said third transistor gate and drain electrodes to said input terminal and to said output terminal, respectively;

means for establishing a potential difference between said input terminal and each of the gate electrodes of said first and said second transistors, said potential difference of a value to maintain the source-to-drain potential of said second transistor smaller than its source-to-gate potential; and means for coupling said first transistor drain electrode to said input terminal.

27. A current amplifier as claimed in claim 26 wherein said means for establishing a potential forms a part of said means for coupling said first transistor drain electrode to said input terminal.

28. A current amplifier as claimed in claim 27 wherein said means for establishing a potential comprises:

a plurality of serially connected semiconductor junctions poled to be forward biased by currents flowing between said first transistor drain electrode and said input terminal.

29. A current amplifier comprising:

an input, an output, and a common terminal;

first and second and third junction transistors, each having base and emitter and collector electrodes, the emitter electrodes of said first and said second transistors being direct current conductively coupled to said common terminal, the emitter electrode of said third field effect transistor being connected to the collector electrode of said second transistor, the collector electrode of said third transistor being connected to said output terminal;

a first interconnection to which the base electrodes of said first and second transistors are each connected;

a direct-coupled collector-to-base feedback connection for said first transistor including, firstly, direct current conductive means connecting the collector electrode of said first transistor to said input terminal and, secondly, means for direct coupling said inpupt terminal to said first interconnection; and means for maintaining a potential between said common terminal and the base electrode of said third transistor of a value such that during operation of the current amplifier the emitter follower action of said third transistor will impose an emitter-to-collector potential on said second transistor smaller than its quiescent emitter-to-base potential.

30. A current amplifier as set forth in claim 29 wherein said direct current conductive means connecting the collector electrode of said first transistor to said input terminal comprises:

a fourth junction transistor having emitter and collector electrodes respectively connected to said first transistor collector electrode and to said input terminal and having a base electrode connected to receive a potential substantially the same as the potential maintained at the base electrode of said third transistor.

31. A current amplifier as set forth in claim 30 wherein said means for maintaining a potential between said common terminal and the base electrode of said third transistor comprises:

a second interconnection to which the base electrodes of said third and said fourth transistors are connected;

a constant-current source connected between said common terminal and said second interconnection; and impedance means connected between said common terminal and said second interconnection.

32. A current amplifier as set forth in claim 31 wherein said impedance means comprises the serial connection of a Schottky diode and a conventional junction diode or its electrical equivalent.

33. A current amplifier as set forth in claim 31 wherein said means for direct coupling said input terminal to said first interconnection is a direct connection without any substantial intervening element.

34. A current amplifier as set forth in claim 30 wherein said means for direct coupling said input terminal to said first interconnection comprises:

a fifth junction transistor having emitter and collector electrodes and having a base electrode connected to said input terminal;

means connected to the collector electrode of said fifth transistor for conditioning it to operate as an emitter-follower or common-collector amplifier stage;

means connected between the emitter electrode of said fifth transistor and said first interconnection for regulating the potential between them, and first resistive means connected between said first interconnection and said common terminal.

35. A current amplifier as set forth in claim 34 wherein said means for maintaining a potential between said common terminal and the base electrode of said third transistor comprises a connection of the base electrode of said third transistor to the emitter electrode of said fifth transistor, to which the base electrode of said fourth transistor is also connected.

36. A current amplifier as set forth in claim 35 wherein said means for regulating the potential between the source electrode of said fifth transistor and said first interconnection comprises:

a Schottky diode connected serially between said first interconnection and said fifth transistor emitter electrode and poled to be rendered forward conducting by the emitter current of said fifth transistor.

37. A current amplifier as set forth in claim 30 wherein said means for direct coupling said input terminal to said first interconnection comprises:

a fifth junction transistor having emitter and collector electrodes and having a base electrode connected to said input terminal;

means connected to the collector electrode of said fifth transistor for conditioning it to operate as an emitter-follower or common-collector amplifier stage;

means connected between the emitter electrode of said fifth transistor and said first interconnection for regulating the potential between them; and second resistive means connected between said first interconnection and the emitter electrode of said fifth transistor.

38. A current amplifier as set forth in claim 37 wherein said means for maintaining a potential between said common terminal and the base electrode of said third transistor comprises a connection of the base electrode of said third transistor to the emitter electrode of said fifth transistor, to which the base electrode of said fourth transistor is also connected.

39. A current amplifier as set forth in claim 29 wherein said direct current conductive means connecting the collector electrode of said first transistor to said input terminal includes:

(a) a first Schottky diode, having first and second ends, being poled for conducting the collector current of said first transistor and having its first end connected to said input terminal, and (b) means for direct current conductively coupling said second end of said first Shcottky diode to said first transistor collector electrode; and wherein said means for direct coupling said input terminal to said first interconnection includes in addition to item (a) claimed herein (c) a connection of the second end of said first Schottky diode to said first interconnection.

40. A current amplifier as set forth in claim 39 wherein said means for direct current conductively coupling said second end of said first Schottky diode to said first transistor collctor electrode comprises:

a second Schottky diode having first and second ends connected respectively to the second end of said first Schottky diode and to the collector electrode of said first transistors and being poled to conduct the collector current of said first transistor.

41. A current amplifier as set forth in claim 29 wherein said means for maintaining a potential between said common terminal and the base electrode of said third transistor comprises, in addition to said first transistor and its direct-coupled collector-to-base feedback connection, a connection of the third transistor base electrode to said input terminal.

\* \* \* \* \*